United States Patent
Gytri et al.

(10) Patent No.: US 9,028,765 B2
(45) Date of Patent: May 12, 2015

(54) EXHAUST FLOW SPREADING BAFFLE-RISER TO OPTIMIZE REMOTE PLASMA WINDOW CLEAN

(71) Applicant: Lam Research Corporation, Fremont, CA (US)

(72) Inventors: Lisa Marie Gytri, Tualatin, OR (US); Stephen Yu-Hong Lau, Lake Oswego, OR (US); James Forest Lee, Damascus, OR (US)

(73) Assignee: Lam Research Corporation, Fremont, CA (US)

(*) Notice: Subject to any disclaimer, the term of this patent is extended or adjusted under 35 U.S.C. 154(b) by 62 days.

(21) Appl. No.: 13/974,540

(22) Filed: Aug. 23, 2013

(65) Prior Publication Data

US 2015/0056108 A1    Feb. 26, 2015

(51) Int. Cl.
B01J 19/08 (2006.01)
H01L 21/02 (2006.01)

(52) U.S. Cl.
CPC ................. H01L 21/02002 (2013.01)

(58) Field of Classification Search
CPC .......... H01L 21/02041; H01L 21/07017; H01L 21/02348; H01L 67/115; H01L 21/02002; B08B 15/00; F15D 1/0005
USPC .......... 422/186.3; 156/345.29, 345.5, 345.51
See application file for complete search history.

(56) References Cited

U.S. PATENT DOCUMENTS

| | | | |
|---|---|---|---|
| 3,504,181 A | 3/1970 | Campbell et al. | |
| 4,527,620 A | 7/1985 | Pedersen et al. | |
| 4,654,226 A | 3/1987 | Jackson et al. | |
| 4,832,777 A | 5/1989 | Davis et al. | |
| 5,005,519 A | 4/1991 | Egermeier et al. | |
| 5,049,739 A | 9/1991 | Okamoto | |
| 5,150,253 A | 9/1992 | Watanuki et al. | |
| 5,240,746 A | 8/1993 | O'Connell Litteral | |
| 5,558,717 A | 9/1996 | Zhao et al. | |
| 5,795,448 A | 8/1998 | Hurwitt et al. | |
| 5,833,290 A | 11/1998 | Curelop et al. | |
| 5,962,085 A | 10/1999 | Hayashi et al. | |
| 5,994,678 A | 11/1999 | Zhao et al. | |
| 6,044,329 A | 3/2000 | Kidd | |

(Continued)

FOREIGN PATENT DOCUMENTS

EP    0 296 891    12/1988

OTHER PUBLICATIONS

U.S. Appl. No. 13/370,579, filed Feb. 10, 2012, entitled "Single-Chamber Sequential Curing of Semiconductor Wafers."

(Continued)

*Primary Examiner* — Xiuyu Tai
(74) *Attorney, Agent, or Firm* — Weaver Austin Villeneuve & Sampson

(57) ABSTRACT

Porogen accumulation in a UV-cure chamber may be reduced by removing outgassed porogen by flowing a purge gas across a window through which a wafer is exposed to UV light. Porogens in the purge gas stream may, as they flow through the chamber and into an exhaust baffle, deposit on surfaces within the chamber, including on the exhaust baffle. The exhaust baffle may have particular features that cause such porogen deposition to be more uniformly distributed across the exhaust baffle, thus reducing the amount of time that may be required to fully clean the baffle of accumulated porogens during a cleaning process.

20 Claims, 15 Drawing Sheets

(56) References Cited

U.S. PATENT DOCUMENTS

| | | |
|---|---|---|
| 6,143,063 A | 11/2000 | Hayashi et al. |
| 6,235,112 B1 | 5/2001 | Satoh |
| 6,244,575 B1 | 6/2001 | Vaartstra et al. |
| 6,291,800 B1 | 9/2001 | Shirakawa et al. |
| 6,497,783 B1 | 12/2002 | Suzuki et al. |
| 6,519,036 B1 | 2/2003 | Hickman |
| 6,524,389 B1 | 2/2003 | Katayama et al. |
| 6,629,012 B1 | 9/2003 | Riley et al. |
| 6,900,413 B2 | 5/2005 | Ratliff et al. |
| 7,020,238 B1 | 3/2006 | Kantonen et al. |
| 7,067,819 B2 | 6/2006 | Janik |
| 7,160,813 B1 | 1/2007 | Chen et al. |
| 7,214,630 B1 | 5/2007 | Varadarajan et al. |
| 7,301,148 B2 | 11/2007 | Johnson |
| 7,327,948 B1 | 2/2008 | Shrinivasan et al. |
| 7,453,560 B2 | 11/2008 | Miyake |
| 7,638,780 B2 | 12/2009 | Kilburn et al. |
| 7,790,243 B2 | 9/2010 | Radhakrishnan et al. |
| 7,935,940 B1 | 5/2011 | Smargiassi |
| 7,941,039 B1 | 5/2011 | Shrinivasan et al. |
| 7,993,937 B2 | 8/2011 | Chen et al. |
| 8,058,181 B1 | 11/2011 | Chen et al. |
| 8,075,789 B1 | 12/2011 | Littau et al. |
| 8,137,465 B1 | 3/2012 | Shrinivasan et al. |
| 8,282,768 B1 | 10/2012 | Smargiassi et al. |
| 8,283,644 B2 | 10/2012 | Smargiassi et al. |
| 8,398,816 B1 | 3/2013 | Gytri et al. |
| 8,454,750 B1 | 6/2013 | Shrinivasan et al. |
| 8,518,210 B2 | 8/2013 | Smargiassi et al. |
| 8,608,035 B2 | 12/2013 | Lee et al. |
| 8,629,068 B1 | 1/2014 | Shrinivasan et al. |
| 8,734,663 B2 | 5/2014 | Smargiassi et al. |
| 2001/0018267 A1 | 8/2001 | Shinriki et al. |
| 2002/0017242 A1 | 2/2002 | Hamaguchi et al. |
| 2002/0134439 A1 | 9/2002 | Kawasaki et al. |
| 2002/0170484 A1 | 11/2002 | Katamine et al. |
| 2003/0015669 A1 | 1/2003 | Janos et al. |
| 2003/0150560 A1 | 8/2003 | Kinnard et al. |
| 2003/0194493 A1 | 10/2003 | Chang et al. |
| 2004/0023513 A1 | 2/2004 | Aoyama et al. |
| 2004/0025787 A1 | 2/2004 | Selbrede et al. |
| 2005/0006916 A1 | 1/2005 | Mantz |
| 2005/0016687 A1 | 1/2005 | Shinriki et al. |
| 2005/0072716 A1 | 4/2005 | Quiles et al. |
| 2005/0085094 A1 | 4/2005 | Yoo |
| 2005/0190248 A1 | 9/2005 | Konno et al. |
| 2006/0021568 A1 | 2/2006 | Matsumoto |
| 2006/0074153 A1 | 4/2006 | Boisseau et al. |
| 2007/0034159 A1 | 2/2007 | Komino et al. |
| 2007/0218204 A1 | 9/2007 | Garg et al. |
| 2010/0055904 A1 | 3/2010 | Chen et al. |
| 2011/0070665 A1 | 3/2011 | Chen et al. |
| 2011/0262870 A1* | 10/2011 | Lee et al. ............... 430/325 |
| 2012/0091097 A1 | 4/2012 | Chen et al. |
| 2012/0161021 A1 | 6/2012 | Smargiassi et al. |
| 2013/0160946 A1 | 6/2013 | Smargiassi et al. |
| 2013/0284087 A1 | 10/2013 | Gytri et al. |
| 2013/0298940 A1 | 11/2013 | Smargiassi et al. |
| 2014/0080324 A1 | 3/2014 | Shrinivasan et al. |

OTHER PUBLICATIONS

U.S. Appl. No. 11/391,134, filed Mar. 28, 2006, entitled "Purging of Porogen from UV Cure Chamber."

US Office Action, dated Oct. 23, 2012, issued in U.S. Appl. No. 13/370,579.

US Office Action, dated Jun. 4, 2013, issued in U.S. Appl. No. 13/370,579.

US Final Office Action, dated Jan. 27, 2014, issued in U.S. Appl. No. 13/370,579.

US Office Action, dated Apr. 25, 2014, issued in U.S. Appl. No. 13/370,579.

US Office Action, dated Mar. 17, 2010, issued in U.S. Appl. No. 12/008,149.

US Notice of Allowance, dated Nov. 19, 2010, issued in U.S. Appl. No. 12/008,149.

US Notice of Allowance, dated Jun. 7, 2012, issued in U.S. Appl. No. 13/070,306.

US Office Action, dated Nov. 19, 2010, issued in U.S. Appl. No. 12/132,559.

US Final Office Action, dated Jun. 9, 2011, issued in U.S. Appl. No. 12/132,559.

US Office Action, dated Nov. 22, 2011, issued in U.S. Appl. No. 12/132,559.

US Office Action, dated Mar. 22, 2012, issued in U.S. Appl. No. 12/132,559.

US Final Office Action, dated Jul. 12, 2012, issued in U.S. Appl. No. 12/132,559.

US Notice of Allowance, dated Oct. 25, 2012, issued in U.S. Appl. No. 12/132,559.

US Notice of Allowance, dated Feb. 11, 2013, issued in U.S. Appl. No. 12/132,559.

US Office Action, dated Aug. 6, 2014, issued in U.S. Appl. No. 13/776,527.

US Notice of Allowance, dated Sep. 25, 2014, issued in U.S. Appl. No. 13/370,579.

US Notice of Allowance, dated Nov. 24, 2014, issued in U.S. Appl. No. 13/370,579.

US Notice of Allowance, dated Mar. 2, 2015, issued in U.S. Appl. No. 13/776,527 [NOVLP267X1].

* cited by examiner

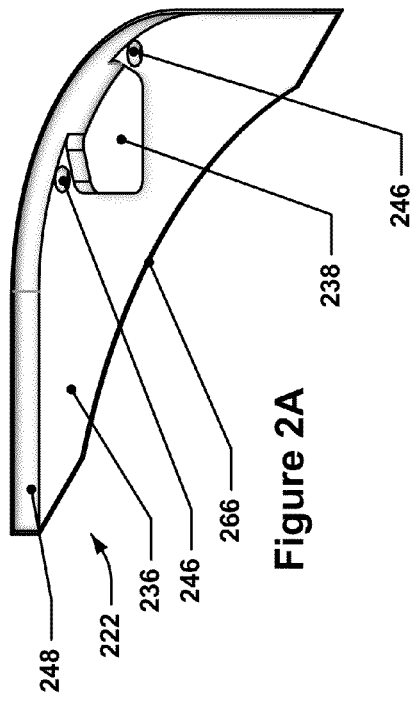
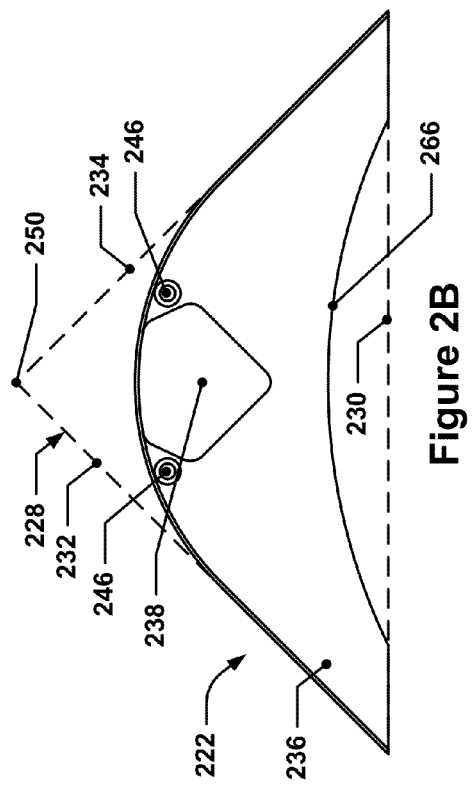
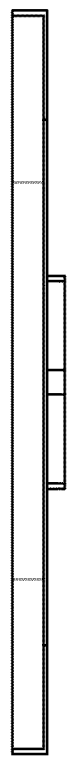
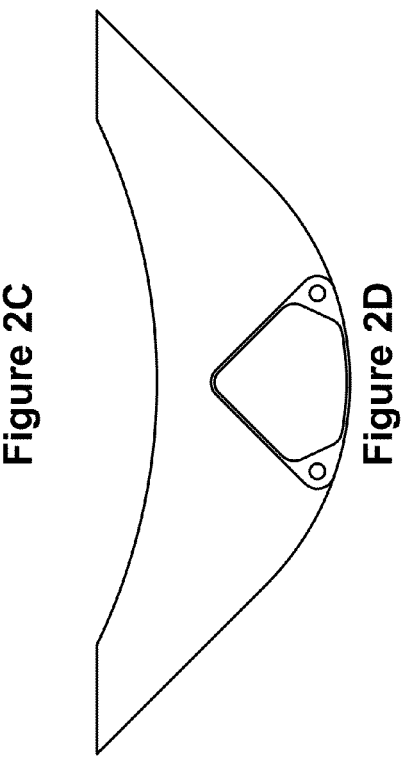

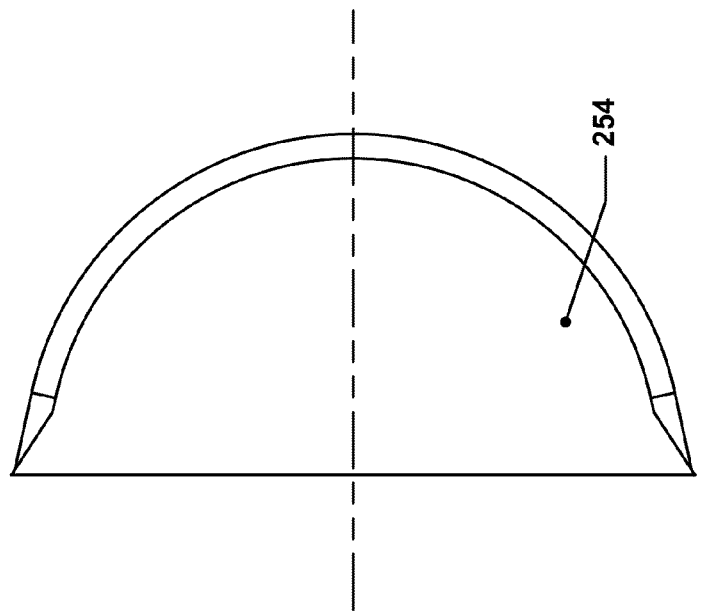
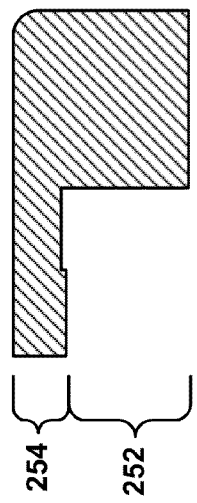
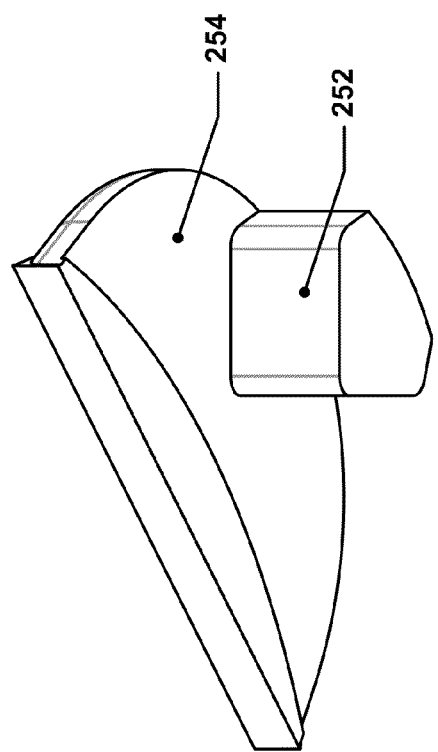
Figure 2G
Figure 2H
Figure 2F

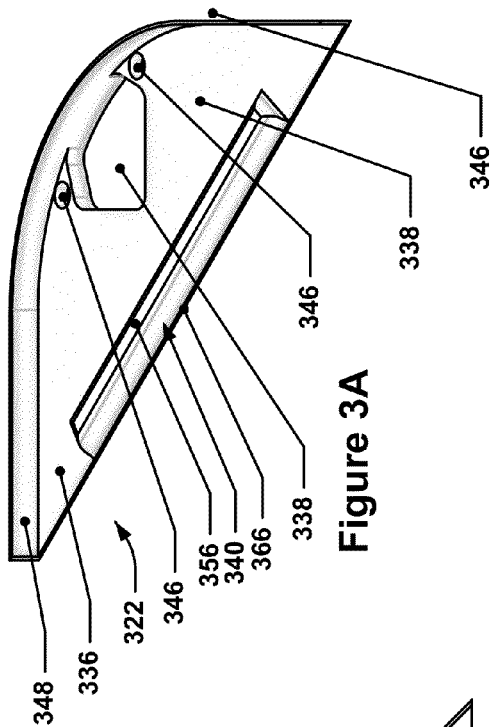
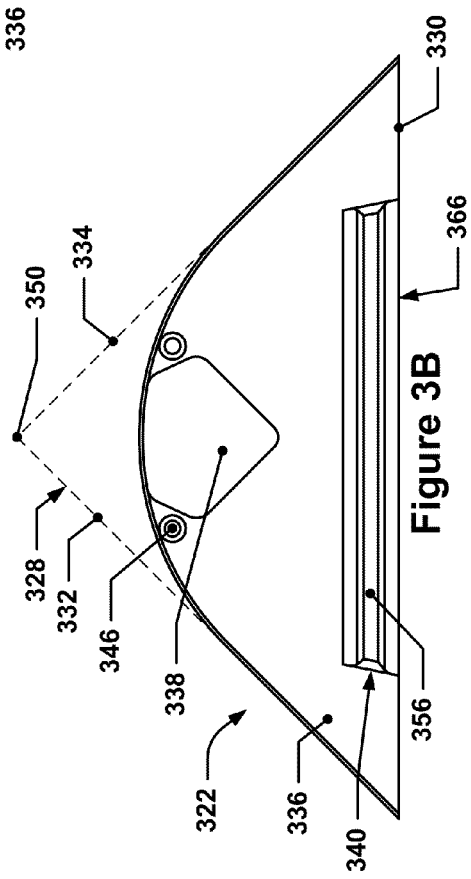
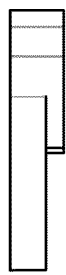
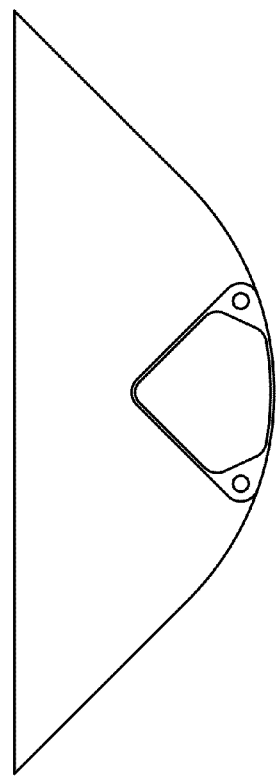
Figure 3A
Figure 3B
Figure 3C
Figure 3D
Figure 3E

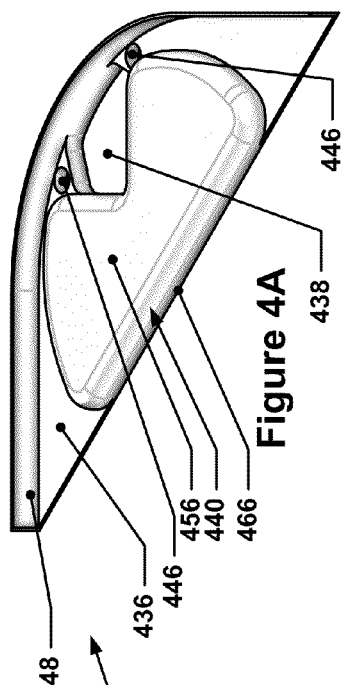
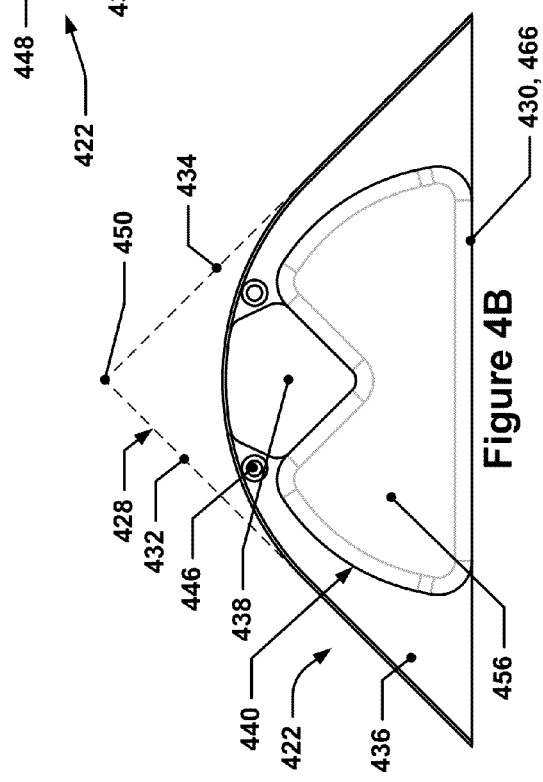
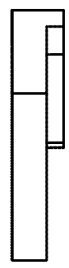
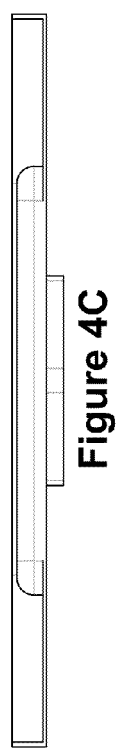
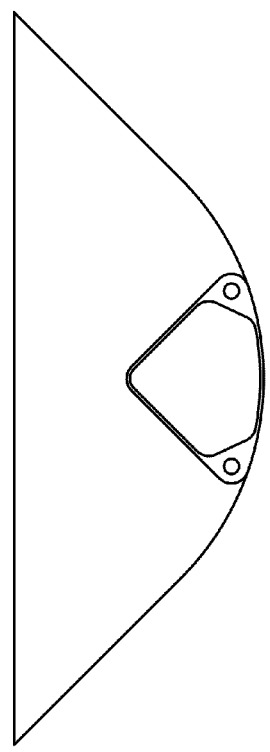

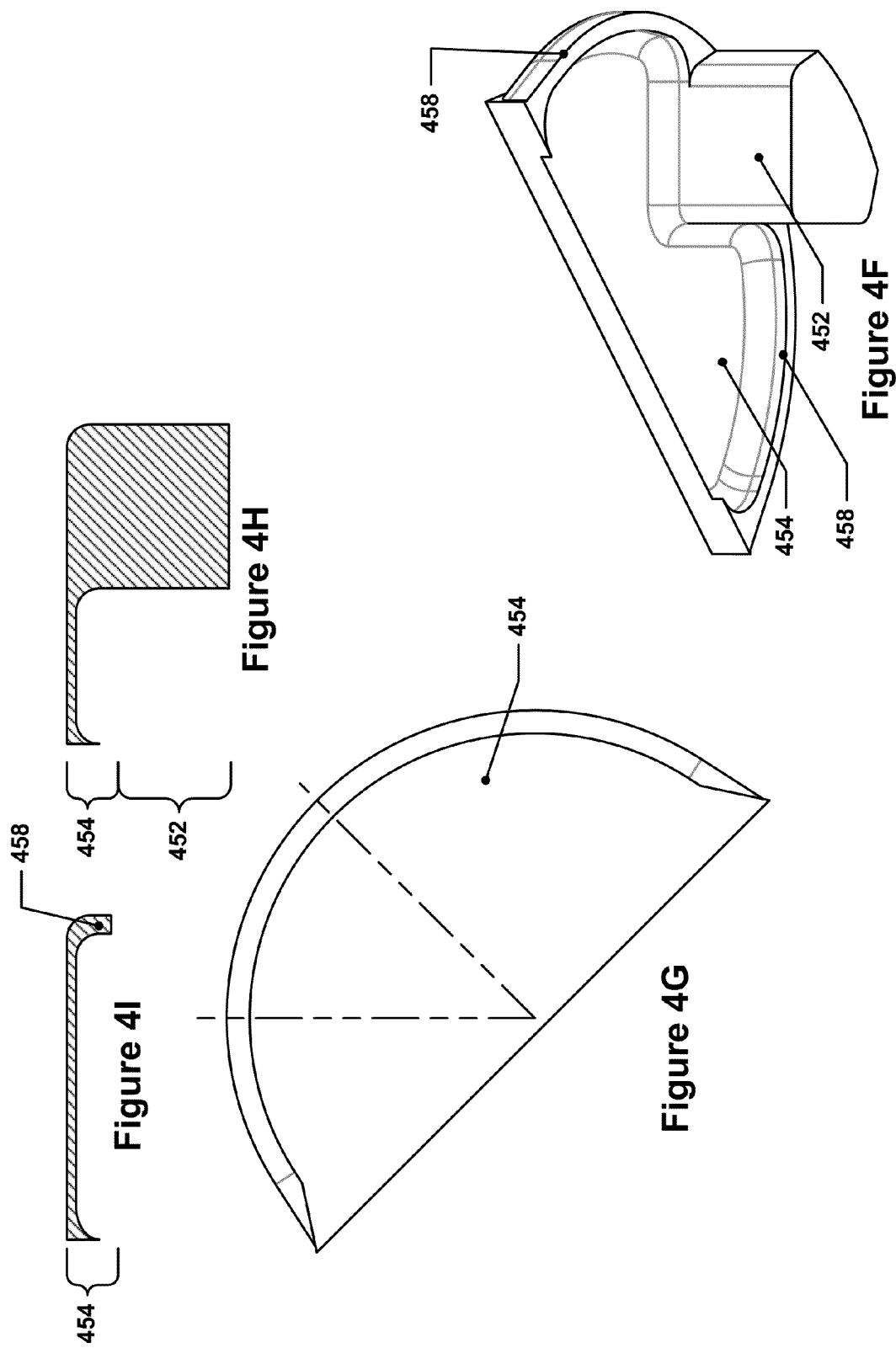

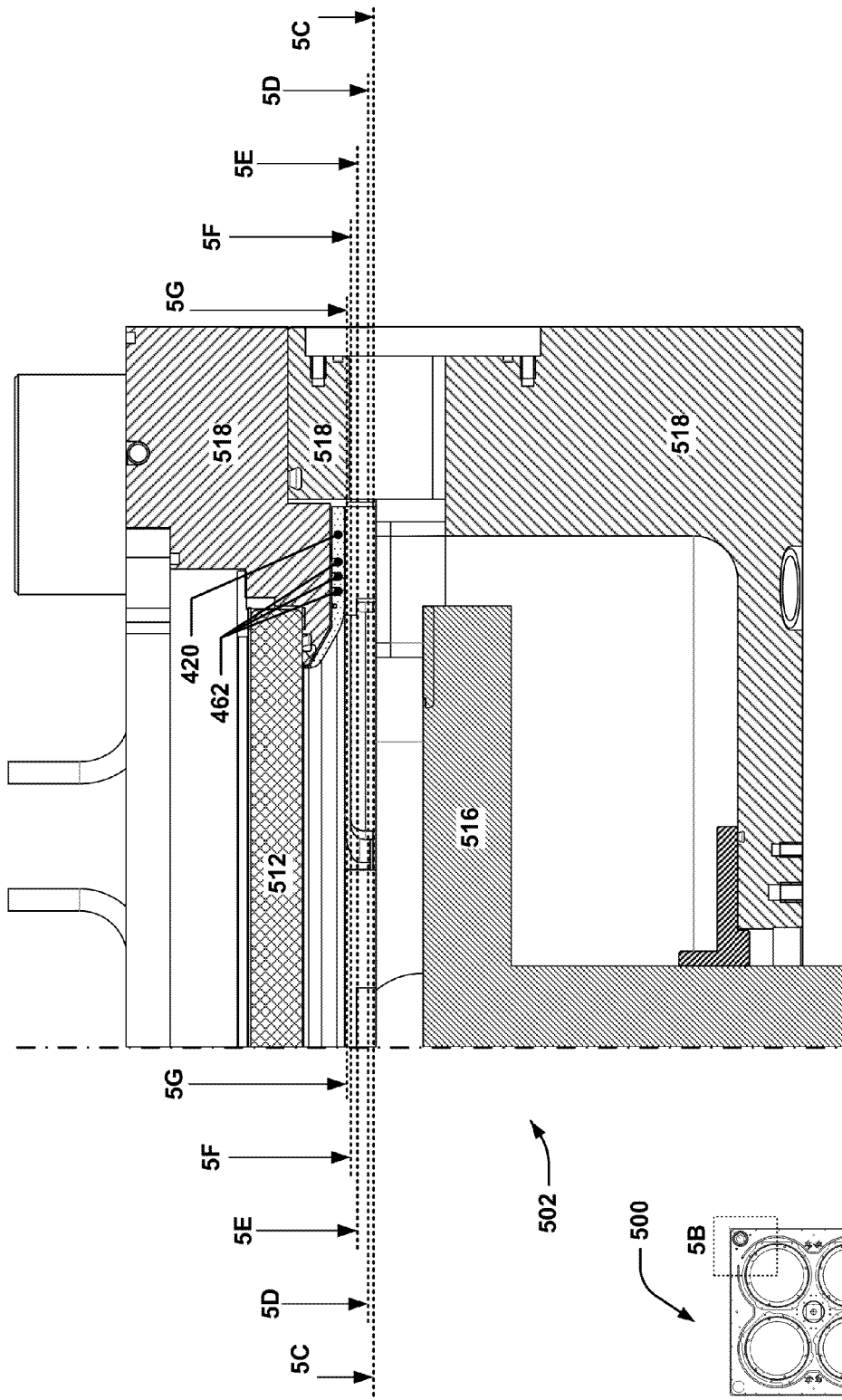

EXHAUST FLOW SPREADING BAFFLE-RISER TO OPTIMIZE REMOTE PLASMA WINDOW CLEAN

FIELD OF THE INVENTION

The invention is related to the field of integrated circuit fabrication, in particular to methods and apparatuses for purging and cleaning process chambers used in the annealing and curing of semiconductor wafers.

BACKGROUND

As integrated circuit (IC) feature sizes shrink, problems of increased resistance and resistance-capacitance (RC) coupling offset any speed advantage derived from the smaller device size, limiting improvement in device performance. Ways to improve device performance and reliability include using highly conductive metals, such as copper, and employing lower dielectric constant (low-k) materials. The lower the dielectric constant of the dielectric, the lower the capacitance of the dielectric and the lower the RC delay of the IC.

Low k dielectrics are conventionally defined as those materials that have a dielectric constant (k) lower than that of silicon dioxide, that is k<~4. Typical methods of obtaining low-k materials include doping silicon dioxide with various hydrocarbons or fluorine. These doping methods, however, generally cannot produce materials with dielectric constants lower than about 2.6. With more and more advanced technology needs, present efforts are focused on developing low-k dielectric materials with k less than 2.5. These ultra low-k (ULK) dielectrics can be obtained by incorporating air voids within a low-k dielectric, creating a porous dielectric material.

Methods of fabricating porous dielectrics typically involve forming a composite film (sometimes referred to herein as a "precursor film") containing two components: a porogen (typically an organic material such as a polymer) and a structure former or dielectric material (e.g., a silicon-containing material). Once the composite film is formed on the substrate, the porogen component is removed, leaving a structurally intact porous dielectric matrix. Techniques for removing porogens from the composite film include, for example, a thermal process in which the substrate is heated to a temperature sufficient for the breakdown and vaporization of the organic porogen. These thermal processes, however, have certain difficulties. In particular, substrate temperatures generally need to be high (i.e., greater than about 400° C.) with exposure times typically on the order of hours. As is well known in the field, these conditions can damage copper containing devices.

Methods have been developed to form a porous low-k or ultra-low-k (ULK) film of dielectric material by first forming a precursor film that contains a porogen and a structure former, or "backbone", on a substrate, and then exposing the precursor film to ultra-violet radiation (UV) in a curing process to remove the porogen. The method is disclosed in U.S. patent application Ser. No. 11/115,576 filed Apr. 26, 2005, having the title "Single Chamber Sequential Curing of Semiconductor Wafers", which is hereby incorporated by reference for all purposes.

The porogens evolved from low-k and ULK dielectric films in a UV cure chamber during a curing process tend to form porogen deposits on internal chamber parts, including on the window, e.g., a quartz window, through which ultraviolet curing (UVC) light is transmitted into the UV cure chamber. The resulting porogen deposit may become a source of particle contamination and a visual blemish. Porogen deposits on the window may inhibit UVC light transmission and thus limit the number of wafers that may be processed in the UV cure chamber before a chamber and window clean process needs to be performed.

SUMMARY OF THE INVENTION

Details of one or more implementations of the subject matter described in this specification are set forth in the accompanying drawings and the description below. Other features, aspects, and advantages will become apparent from the description, the drawings, and the claims. Note that the relative dimensions of the figures may not be drawn to scale unless specifically indicated as being scaled drawings.

In some further implementations of the UV semiconductor processing tool, the exhaust baffle may be substantially symmetric about a symmetry plane that intersects a vertex of the triangular region opposite a first leg of the triangular region proximate to the inlet edge. The symmetry plane may be substantially perpendicular to the first leg.

In some further implementations of the UV semiconductor processing tool, the inlet edge may be substantially straight and may correspond with the first leg and the first side edge and the second side edge may be substantially coincident with second and third legs of the triangular region.

In some further implementations of the UV semiconductor processing tool, the base surface may have a rounded corner proximate to the vertex of the triangular region opposite the first leg.

In some further implementations of the UV semiconductor processing tool, the raised profile section may have a cross-section in a plane parallel to the base surface that substantially corresponds with a semicircular area of radius R. In some such, wherein the semicircular area has a notch in it substantially centered on the symmetry plane and extending towards the inlet edge by a distance of at least approximately ½ R.

In some such further implementations of the UV semiconductor processing tool, the at least one other component of the semiconductor process chamber with which the exhaust baffle is configured to interface may include a substantially semicircular recess with a radius R', where R' is at least 1.05R. In some such further implementations of the UV semiconductor processing tool, the difference between R' and R may be at least approximately twice as large as the difference between the first distance and the second distance. In some further implementations of the UV semiconductor processing tool, the notch may be a triangular notch with an included angle of approximately 90°. In some other such implementations of the UV semiconductor processing tool, the notch may be a semicircular notch.

In some further implementations of the UV semiconductor processing tool, the first distance may be at least 75% of the second distance.

In some further implementations of the UV semiconductor processing tool, the raised profile section may have a substantially symmetric trapezoidal cross-sectional shape in a plane substantially perpendicular to the inlet edge and the trapezoidal cross-sectional shape may be widest at the base surface.

These and other features and advantages of the invention will be described in more detail below with reference to the associated drawings.

BRIEF DESCRIPTION OF THE DRAWINGS

Reference is made throughout this disclosure to the drawings listed below.

FIGS. 2A through 2E are isometric, top, front, bottom, and right side views, respectively, of an example inlet baffle.

FIGS. 2F through 2H depict off-angle, top, and section views, respectively, of the nominal flow volume achievable with the example inlet baffle of FIGS. 2A through 2E.

FIGS. 3A through 3E are isometric, top, front, bottom, and right side views, respectively, of an example inlet baffle.

FIGS. 4A through 4E are isometric, top, front, bottom, and right side views, respectively, of an example inlet baffle.

FIGS. 4F through 4H depict off-angle, top, and section views, respectively, of the nominal flow volume achievable with the example inlet baffle of FIGS. 4A through 4E.

FIG. 5A depicts a top view of an example UV cure semiconductor processing tool.

FIG. 5B depicts a section view of the example UV cure semiconductor processing tool within box 5B of FIG. 5A.

FIGS. 1A through 6B are to scale within each Figure, although the scale may different between Figures.

DETAILED DESCRIPTION OF SPECIFIC EMBODIMENTS

Figure 1A:
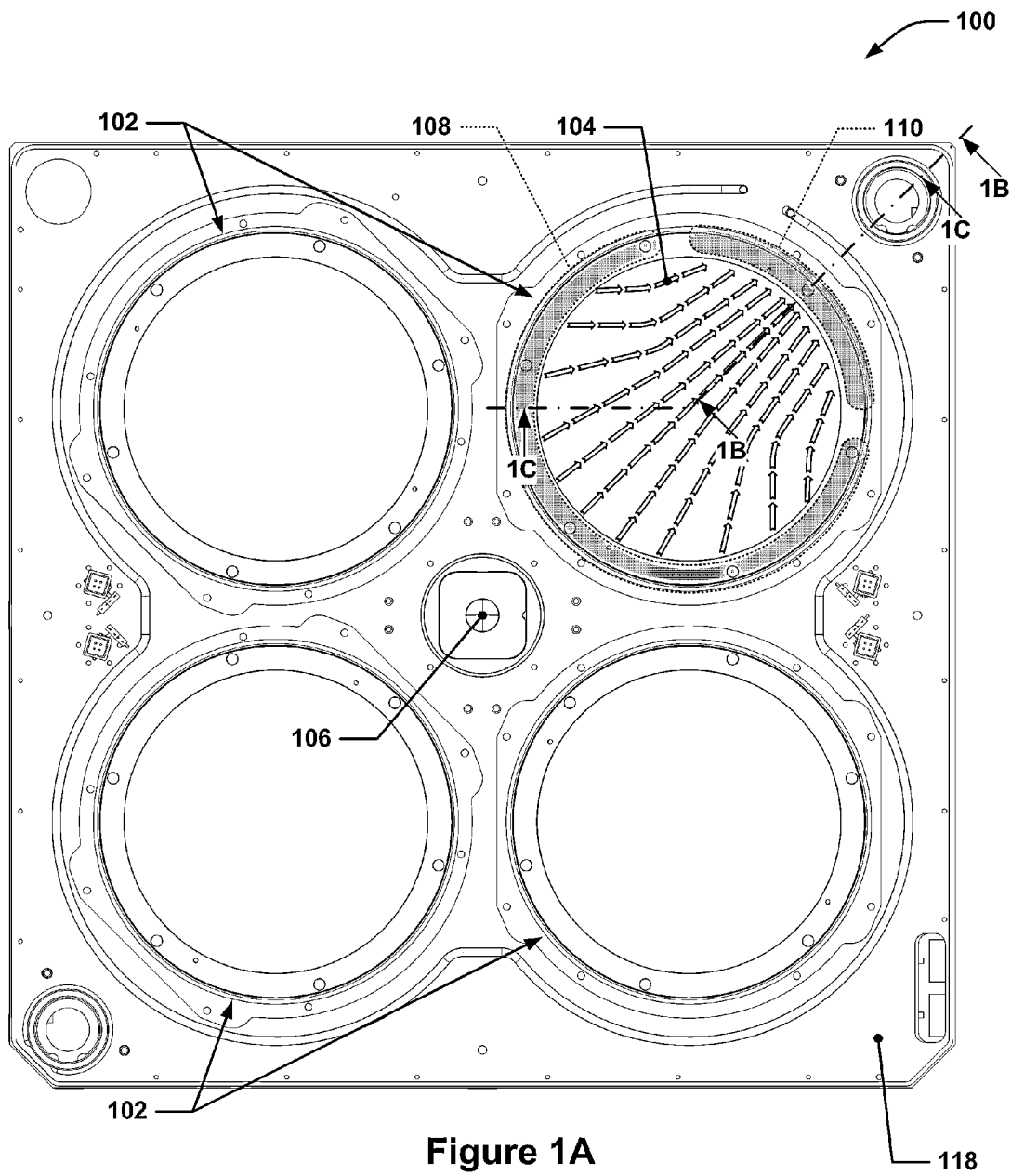
FIG. 1A depicts a top view of an example UV cure semiconductor processing tool.

In the following detailed description, numerous specific implementations are set forth in order to provide a thorough understanding of the concepts discussed herein. However, as will be apparent to those skilled in the art, the concepts discussed herein may be practiced without these specific details or by using alternate elements or processes. In other instances well-known processes, procedures, and components have not been described in detail so as not to unnecessarily obscure aspects of the present disclosure.

In this application, the terms "substrate" and "wafer" will be used interchangeably. The following detailed description assumes the concepts discussed herein are implemented on semiconductor processing equipment. However, the concepts discussed herein are not so limited and may be implemented on tools and equipment configured to perform related processes. For example, in addition to being used on equipment for processing semiconductor wafers, the concepts described herein may also be used on equipment used to process other work pieces, such as display face planes, printed circuit boards, solar cell wafers, Micro-Electro-Mechanical Systems (MEMS), and the like. Apparatuses utilizing the concepts discussed herein may also be utilized to process work pieces of various shapes, sizes, and materials.

UV treatment of semiconductor wafers has many applications including removing porogens, strengthening dielectric films, repairing damage to low dielectric films, stabilizing fluorosilicate glass films, improving hermeticity and selectivity of SiC etch stop films, curing nitrides and oxides, extracting water produced during dielectric, e.g., silicon oxide, deposition, densification of dielectric materials, and increasing stress in dielectric films, e.g., for strained gates. UV curing has also been employed to lower the k-value of other dielectric materials such as oxides deposited by pulse deposition layer (PDL) processes.

For example, as device geometry shrinks, integrated circuits (IC) require dielectric films with smaller capacitance values. IC manufacturers have obtained low capacitance by inducing porosity in these dielectric films. Inclusion of porosity in dielectric films is accomplished by co-depositing the backbone dielectric material (typically an organo-silicate glass or OSG) with a pore generator (typically an organic material). However, inducing this kind of porosity causes degradation in the mechanical properties of the film, reducing its ability to sustain subsequent integration steps without mechanical damage. After the deposition, the pore generator (porogen) must be removed from the ULK precursor film, and the backbone dielectric material strengthened for further processing. UV radiation may be used to both remove the porogen removal and strengthen the backbone dielectric material. The UV radiation drives out the porogen from the dielectric film and rearranges the bond structure in the residual material to strengthen it and to render it capable of sustaining subsequent processing. The cured film may have an ultra-low dielectric constant of about 2-2.5.

The curing of semiconductor wafers may take place in a chamber that may or may not be in a vacuum. A wafer may be placed in the chamber and exposed to UV radiation. The process of curing ultra-low k (ULK) films on semiconductors may be time-consuming with cure times of up to twenty minutes. In multi-station ultraviolet cure processes, the porogen removal step tends to occur first, followed by the cross-link strengthening of the ULK film. The porogens are hydrocarbons that may deposit onto chamber interior walls, windows and other reactor parts. The porogen must be cleaned from the reactor/chamber periodically to avoid clouding the window through which the ultra-violet radiation enters the reactor/chamber and to avoid unwanted particles on the chamber internals walls and parts that can delaminate and contaminate the wafer.

Lam Research produces a range of UV-cure tools under the SOLA® brand name, including the SOLA® xT and the SOLA® Excel. These, as well as other UV-cure tools produced by other manufacturers, may benefit from the components discussed herein.

FIG. 1A depicts a top view of an example UV cure semiconductor processing tool. The UV cure tool 100 shown, for example, may generally correspond to the SOLA® Excel tool. To give a sense of scale, such a tool may be sized to process 300 mm diameter semiconductor wafers. A four-station tool such as UV cure tool 100 may, for example, measure approximately 44" square. A wafer may enter the UV cure tool 100 via a port (not shown) located on the side housing 118 of UV cure tool 100. Cleaning gas or carrier gas may flow from a gas inlet region 108 into each process chamber 102 (there are four process chambers shown, although other UV cure semiconductor processing tools may have more or less such process chambers).

The cleaning gas and/or carrier gas may be supplied to the gas inlet region 108 from a gas source 106. In the depicted implementation, the gas source 106 is substantially centered between each of the four process chamber 102 such that it may supply cleaning and/or carrier gases to all four process chambers 102 simultaneously and under substantially identical flow conditions. In other implementations, however, the gas source 106 may be located and/or configured differently.

The cleaning and/or carrier gas flowed into the process chamber 102 may flow across the process chamber and into a gas exhaust region 110, as represented by gas flow arrows 104 (it is to be understood that gas flow arrows 104 are notional and that the actual gas flow paths may differ from those depicted, although the gas flow paths may still generally travel across the wafer/window from one side to the other). An example flow rate of the cleaning gas through a process chamber may be on the order of 4.5 standard liters per minute (slm). A similar example flow rate for the carrier/purge gas may be on the order of 12.5 slm.

Figure 1B:
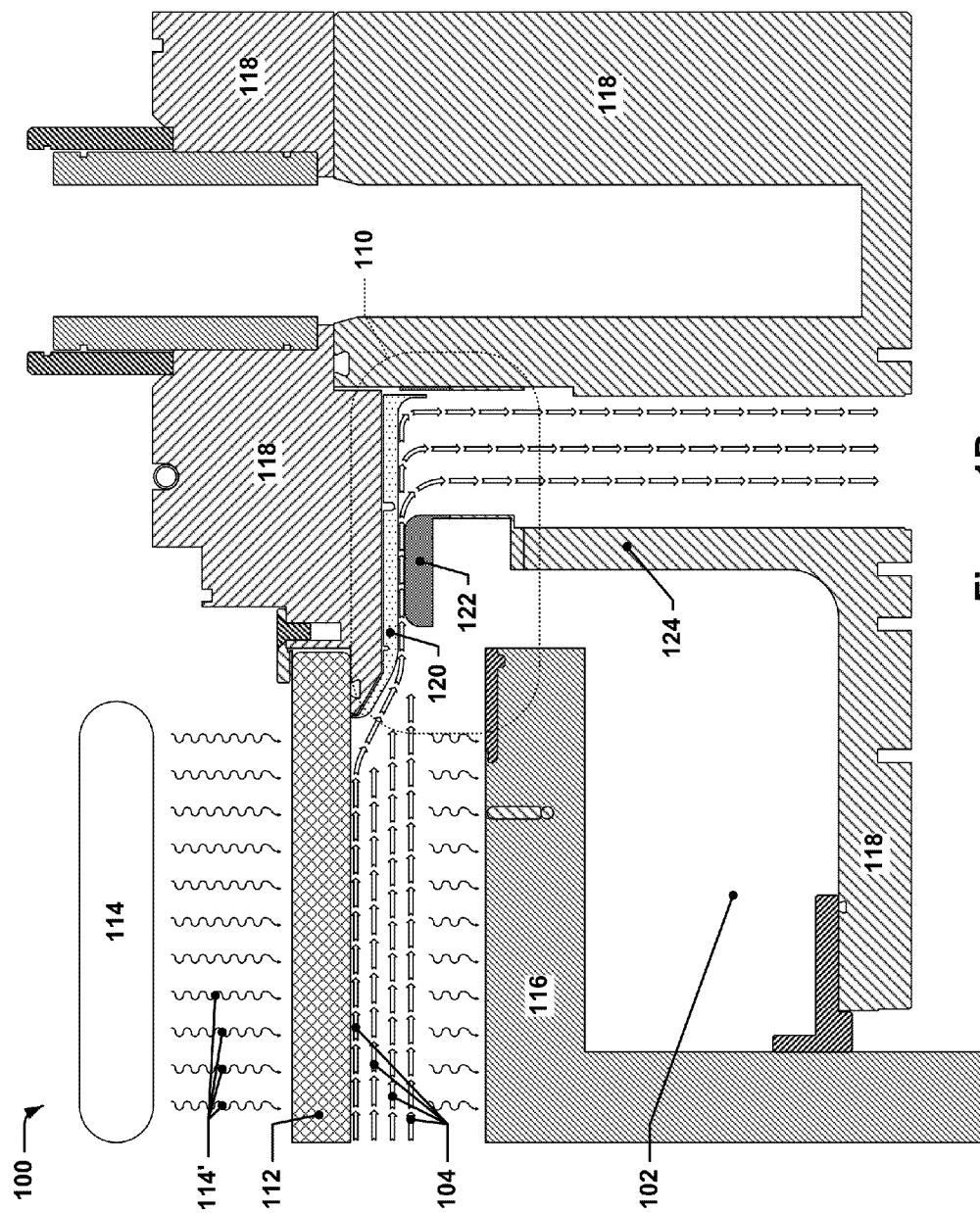
FIG. 1B is a section view of the example UV cure semiconductor processing tool of FIG. 1A along section line 1B.
Figure 1C:
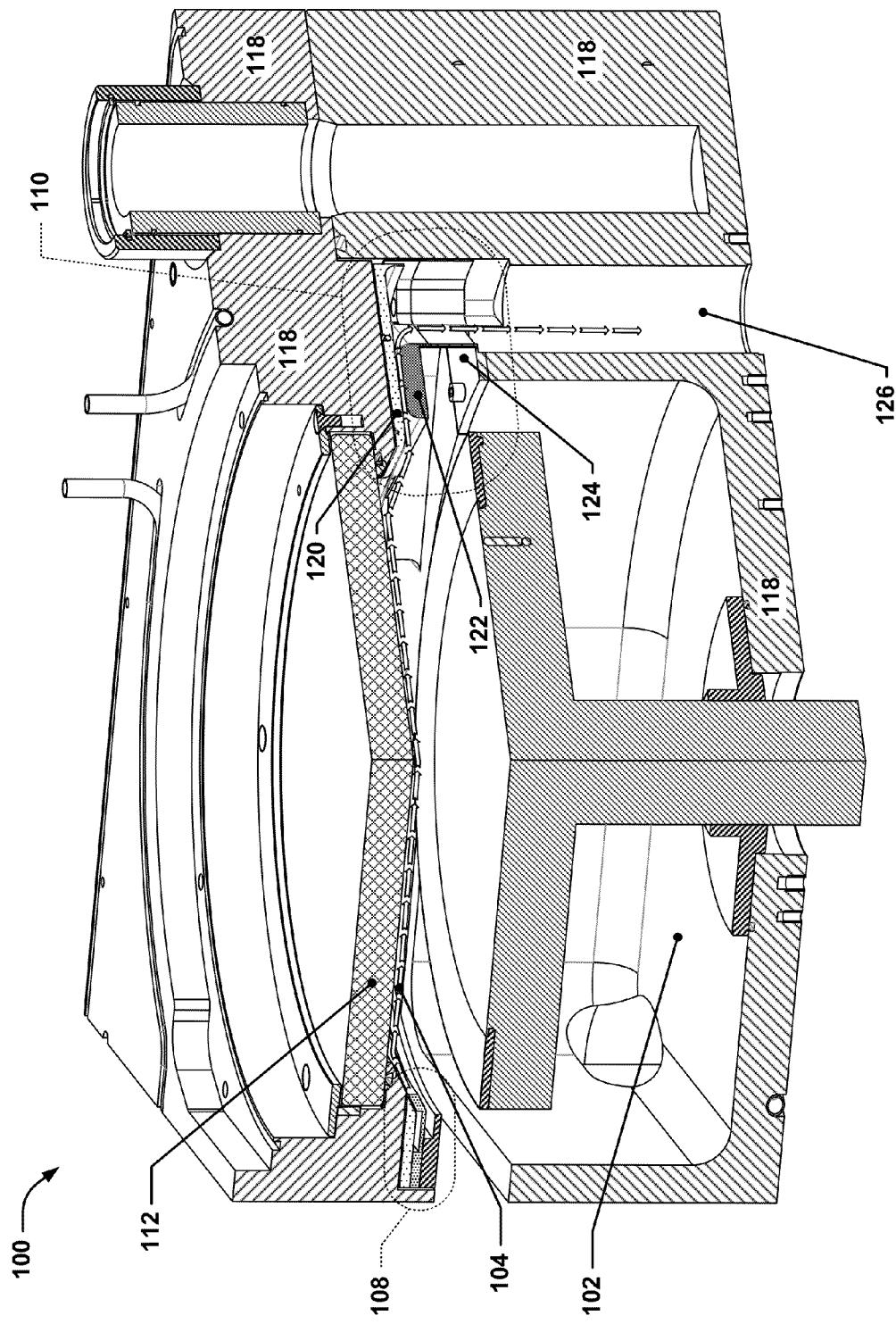
FIG. 1C is a three-dimensional cutaway view of the example UV cure semiconductor processing tool of FIG. 1A along section line 1C.

FIG. 1B is a section view of the example UV cure semiconductor processing tool of FIG. 1A along section line 1B. Only half of the processor chamber 102 is shown in FIG. 1B. A notional UV light source 114 is also shown in FIG. 1B, as is UV light 114' that is radiated from the UV light source 114. The UV light 114' may shine through the window 112 and strike a porogen-containing wafer (not shown) that is supported on a pedestal 116 within the process chamber 102. The porogen-containing wafer may emit porogens while being exposed to the UV light 114'. While such exposure is occurring, a carrier gas may be flowed across the wafer, as represented by the flow arrows 104. The carrier gas may be introduced to the process chamber via the gas inlet region 108 and may then, due to a vacuum drawn on gas exhaust region 110 by exhaust passage 126, flow into a baffle area of the process chamber 102 before being evacuated from the UV cure tool via the exhaust passage 126. The baffle area may, as shown in FIG. 1C and other Figures in this disclosure, be comprised of two main pieces, e.g., a heated (or unheated) exhaust cap 120 and a baffle 122. An exhaust plenum volume may be formed in the space between the exhaust cap 120 and the baffle 122 (or between other components providing or defining an exhaust plenum volume). The carrier gas may flow through the exhaust plenum volume before flowing through a riser volume in riser 124 and out through the exhaust passage 126. It is to be understood that other combinations of components (or even single components) may be used to provide the exhaust plenum volume discussed herein; such alternative implementations are also intended to be within the scope of this disclosure.

FIG. 1C is a three-dimensional cutaway view of the example UV cure semiconductor processing tool of FIG. 1A along section line 1C. It is to be understood that the gas flow path 104 illustrated follows the section line (so as to be clearly visible to the viewer), but that actual gas flow may follow more natural flow paths. Although the carrier gas may act to sweep away the majority of the released porogens, some porogens may nonetheless still adhere to the window 112 and to other interior surfaces of the process chamber 102, including to the baffle 122. After sufficient porogen has accumulated on these surfaces, e.g., enough to cause the UV transmissivity of the window 112 to decrease to the point that UV cure time must be increased to undesirable levels or to cause an undesirable risk of accumulated porogen material flaking off and causing particulate contamination, a cleaning cycle may be initiated.

Typically, the cleaning cycle is performed without a wafer being present since the cleaning cycle may damage the wafer. In the cleaning cycle, a cleaning gas, such as radicalized $O_2$, may be flowed into the process chamber 102 through the gas inlet region 108. The cleaning gas may flow along substantially similar flow paths 104 as the carrier gas, and may thus contact the same surfaces. The cleaning gas may act to etch away the accumulated porogen material and sweep it into the exhaust passage 126.

Various baffle plenum volumes are now discussed. Each of the three baffles discussed below may be interchangeably used in place of baffle 122 of FIGS. 1A through 1C (in fact, baffle 122 is identical to the baffle shown in FIGS. 4A through 4E) to produce differently-shaped baffle plenum volumes. The baffles may be made from materials chemically compatible with the semiconductor processing environment of the UV cure tool, e.g., aluminum.

FIGS. 2A through 2E are isometric, top, front, bottom, and right side views, respectively, of an example inlet baffle. FIGS. 2F through 2H depict off-angle, top, and section views, respectively, of the nominal flow volume achievable with the example inlet baffle of FIGS. 2A through 2E.

As can be seen, baffle 222 has a base surface 236 that is substantially inscribed in a triangular region 228. This allows the baffle 222 to be placed in a corner formed between a substantially round pedestal 116 and the exterior walls of the substantially rectangular housing 102. Such baffles may be referred to herein and elsewhere as "corner baffles."

The triangular region 228 may have a first leg 230, a second leg 232, and a third leg 234. The base surface 236 may have an inlet edge 266 that is proximate to the first leg 230, and may have a first edge that is proximate to the second leg 232 and a second edge that is proximate to the third leg 234. The baffle may also have an edge wall 248 that is proximate to the second leg 232 and the third leg 234; in the depicted example, the edge wall 248 has a height of approximately 0.5". The edge wall 248 may contact, or come close to contacting, a neighboring part, e.g., the heated exhaust cap 120, and may be rounded.

In the depicted example, the triangular region may have a first leg 230 that is approximately 10.70" in length and that is spaced off from vertex 250 by a distance of approximately 5.35". The second leg 232 and the third leg 234 may be equal in length and may form a right angle with one another. The depicted example also features a rounded corner on the part of the baffle that is closest to the vertex 250. The outside radius of the baffle 222 closest to the vertex 250 may, for example, be approximately 4.125". Corner baffles with other dimensions are also considered to be within the scope of this disclosure.

The base surface 236 may have an exhaust aperture 238 that passes through the base surface 236 and that is located opposite the inlet edge 266. The exhaust aperture 238 may have other shapes as well, although the version shown is particularly well-suited for accommodating wafer insertion ports located on one or both sides of a housing such as housing 118. For example, the two interior side walls of the exhaust aperture 238 that are closes to the inlet edge may be at 90 degrees to one another and may each be offset by a distance greater than the wafer diameter from corresponding parallel axes that intersect the center of the corresponding pedestal. For example, if the wafer is a 300 mm wafer, the interior side walls may be offset by a distance of approximately 0.75" more than 150 mm from mutually perpendicular axes that intersect at the pedestal center. The baffle 222 may also have holes, e.g., countersunk holes, 246 to allow the baffle 222 to be mounted to, for example, risers 124.

When assembled into a UV cure tool, such as UV cure tool 100, the baffle 222 may form an exhaust plenum volume 254 between the baffle 222 and another component, e.g., the heated exhaust cap 120. The exhaust plenum volume 254, as shown in FIGS. 2F through 2H, may have a substantially uniform cross-sectional thickness, e.g., 0.48" as shown in FIG. 2H, in the vertical direction (with respect to the drawing text orientation). There is a slight step-down visible in FIG. 2H, which is a cross-section of the exhaust plenum volume 254 and riser volume 252 along the centerline shown in FIG. 2G, but this is due to the absence of material along the arcuate inlet edge 266 (rather than being formed between the baffle 222 and the heated exhaust cap 120). The exhaust plenum volume 254 may be fluidly adjoined to a riser volume 252 that is contained within the exhaust aperture 238 and the riser 124; the riser volume 252 may be fluidly connected with the exhaust passage 126.

The present inventors have realized that gas flow using baffle 222 may be substantially biased towards the center, e.g., the symmetry axis, of the baffle 222. As a result, more porogen-containing carrier gas may pass over the surfaces of the baffle 222 that are closest to the symmetry axis, causing the rate of porogen build-up along the symmetry axis to be much higher than the porogen build-up rate in other areas of the baffle 222. The porogen build-up rate along the symmetry axis of the baffle 222 may also be considerably higher than the porogen build-up rate on other components of the process chamber, e.g., such as on the window 112 or the pedestal 116 (the pedestal 116 may have a very low rate of porogen build-up since it is substantially covered by wafers during processing).

The present inventors have discovered that, as a result of this flow bias, it may take an order of magnitude or more longer to clean the baffle 222 than it takes to clean other surfaces in the process chamber, e.g., the pedestal 116 or the window 112. For example, it may take on the order of 1 to 2 minutes to clean the window 112, but it may take an additional 10 to 15 minutes to clean the baffle 222 to a similar degree of cleanliness due to the deeper accumulation depth of the porogen on the baffle 222.

In order to combat the flow bias discussed above, the baffle 222 may be modified to include a raised profile section that acts to temporarily narrow the cross-section inlet flow area at or near the inlet edge 266. Two baffles incorporating such a raised profile section feature are discussed below.

Figure 3G:
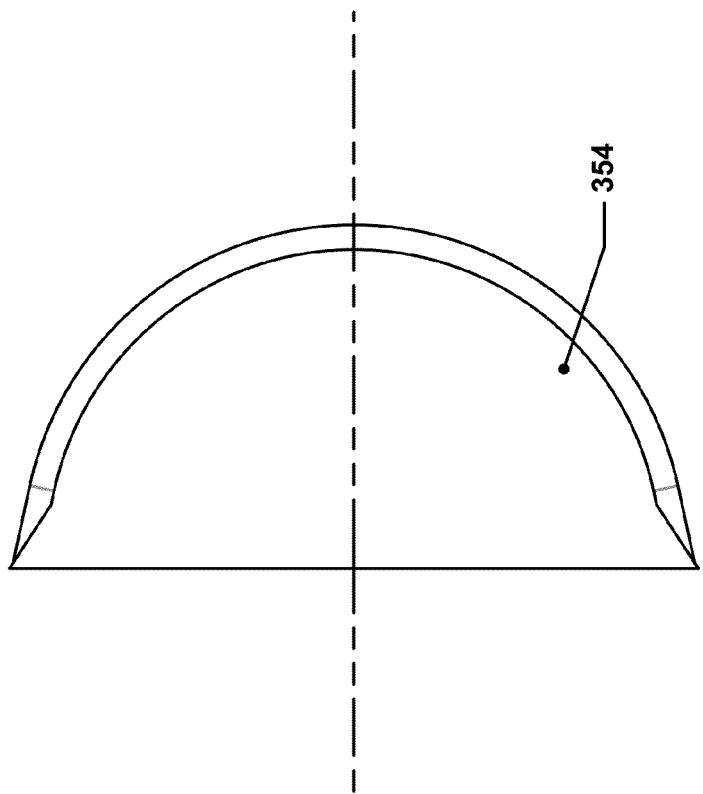
FIGS. 3F through 3H depict off-angle, top, and section views, respectively, of the nominal flow volume achievable with the example inlet baffle of FIGS. 3A through 3E.
Figure 3H:
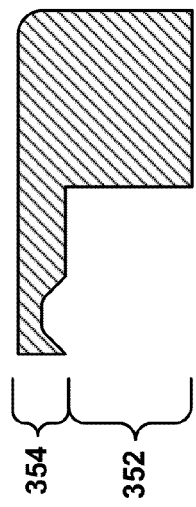
Figure 3F:
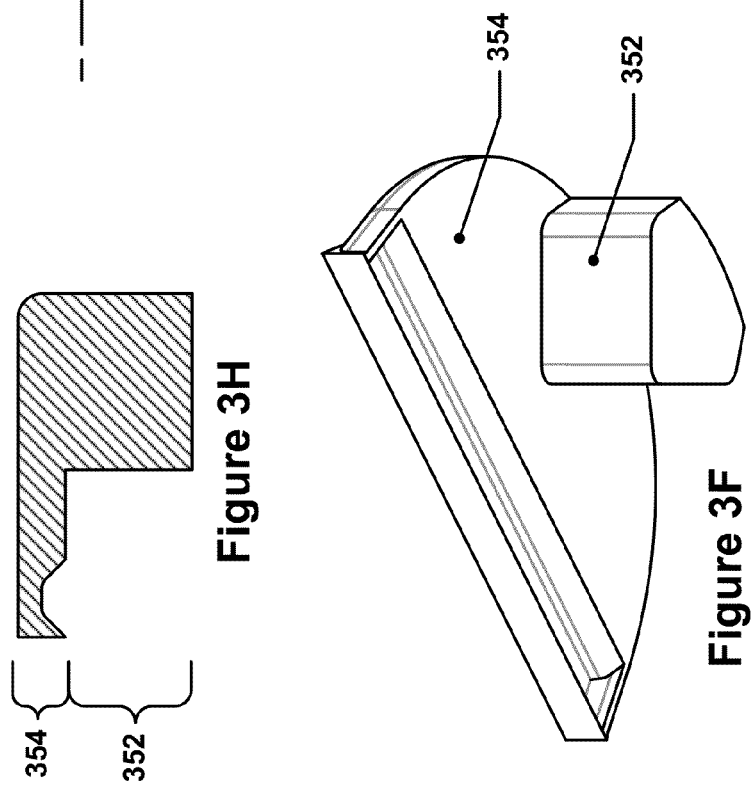

FIGS. 3A through 3E are isometric, top, front, bottom, and right side views, respectively, of an example inlet baffle. FIGS. 3F through 3H depict off-angle, top, and section views, respectively, of the nominal flow volume achievable with the example inlet baffle of FIGS. 3A through 3E.

The baffle 322 shown in FIGS. 3A through 3E is substantially similar to the baffle 222 shown in FIGS. 2A through 2E, although there are some differences, as set forth in more detail below. First, the inlet edge 366 is shown as being straight rather than having a partially (shallow) arcuate shape. Second, a raised profile section 340 has been added to the baffle proximate to the inlet edge 366. The raised profile section 340, in this case, is formed by a trapezoidal cross-section that extends in directions perpendicular to the symmetry axis of the baffle 322. This trapezoidal cross-section is symmetric about the baffle symmetry axis and has its larger base proximate to the base surface 336. One or more edges of the raised profile section 340, e.g., the top edges defining upper surface 356 and/or the edges defined by the intersection of the raised profile section 340 with the base surface 336, may be rounded or filleted to eliminate hard edges, if desired. The upper surface 356 of the raised profile section 340 may, for example, be offset from the base surface 336 by a first distance. The base surface may also be offset from one or more other components, e.g., the heated exhaust cap 320, when installed in a UV cure tool such as UV cure tool 100 such that the base surface 336 is offset from such one or more other components by a second distance (the second distance may, for example, be measured as the normal distance from the plane of the base surface 336 to the closest surface of the one or more other components within the area bounded by the upper surface 356). The first distance may be at least 50% of the second distance. In the depicted example, the first distance is approximately 0.24" and the second distance is approximately 0.48".

The raised profile section may extend along directions perpendicular to the symmetry axis sufficiently far enough that the resulting gap formed between the raised profile section 340 and the surfaces of the other components closest to the raised profile section is approximately the same order of magnitude as the difference between the first distance and the second distance. In the depicted example, the raised profile section is approximately 6.25" in length along the long axis, 0.79" wide at the base, and 0.31" wide at the upper surface. As will be evident from FIG. 6B, the raised profile section 340 may protrude into a recess on an adjacent component. The recess may not extend across the entire width of the inlet edge 366, and the raised profile section 340 may, correspondingly, extend in a direction parallel to the inlet edge 366 (or the first leg 330) to a slightly lesser extent than the recess does in that direction.

While the baffle 322 shown in FIGS. 3A through 3E results in a less biased porogen build-up on the baffle 322, the present inventors determined that a further new baffle design may prove even more advantageous. FIGS. 4A through 4E are isometric, top, front, bottom, and right side views, respectively, of such an example inlet baffle. FIGS. 4F through 4H depict off-angle, top, and section views, respectively, of the nominal flow volume achievable with the example inlet baffle of FIGS. 4A through 4E.

The baffle 422 shown in FIGS. 4A through 4E is substantially similar to the baffle 222 shown in FIGS. 2A through 2E, although there are some differences, as set forth in more detail below. As with the baffle 322, the baffle 422 has a straight inlet edge 466 as opposed to the slightly arcuate inlet edge 266 of baffle 222. A further difference, however, is that the baffle 422 has a raised profile section 440 that occupies a much large percentage of base surface 436 than the raised profile section 340 does of the base surface 336.

For example, the raised profile section 440 features a substantially semi-circular cross-section in a plane parallel to the base surface 436. The semi-circular cross-section may have a notch located along the symmetry axis of the baffle 422. The notch may, for example, be coextensive with the exhaust aperture, i.e., formed by the subtraction of the exhaust aperture cross-sectional interior profile from the semi-circular cross-section. While the notch depicted in FIGS. 4A through 4E is substantially V-shaped and has an included angle of approximately 90°, other notch profiles, e.g., round profiles, are also possible and contemplated as being within the scope of this disclosure. In the example shown in FIGS. 4A through 4E, the substantially semi-circular cross-section has a nominal radius of approximately 3.15".

The raised profile section 440 also has an upper surface 456 that is offset from the base surface 436 by a first distance. The first distance may, as in the baffle 322, have a value that is at least 50% of a second distance between the base surface 436 and one or more other components of the UV cure tool (again, the second distance may, for example, be measured as the normal distance from the plane of the base surface 436 to the surface of the one or more other components that is closest to the raised profile section within the area bounded by an upper surface 456). In the depicted implementation, the first distance is more than 75% of the second distance.

Holes 446 may be provided to allow the baffle 422 to be secured to a mating part, e.g., a riser such as riser 124. As with the baffle 322, the raised profile section 440 may have one or more edges that are rounded or filleted. In the depicted example, the edges of the raised profile section 440 that lie in the plane of the upper surface 456 or are normal to the upper surface 456 are rounded.

As can be seen in FIGS. 4F through 4H, the baffle 422 may produce a substantially differently-shaped exhaust plenum volume 454 than is produced by the baffles 222 and 322. As is evident in FIG. 4F, substantially arcuate side passages 458 may be formed about the periphery of the exhaust plenum volume 454. The arcuate side passages 458 may extend from the inlet edge 466 to the exhaust aperture 438 on opposing sides of the baffle 422. At the same time, the interior of the semi-circular region may be largely occupied by the raised profile section 440, causing gas that flows across the inlet edge 466 and not through the arcuate side passages 458 to flow through a constricted space between the raised profile section 440 and the one or more other components. The arcuate side passages may generally have a width of the same magnitude as the difference between the first distance and the second distance. For example, the width of the arcuate side passages may be 0.2", whereas the difference between the first distance and the second distance may be 0.1".

The cross-sections shown in FIGS. 4I and 4H show cross-sections of the exhaust plenum volume 354 and the riser volume 352 along two different section lines of FIG. 4G. Each section line intersects with the respective section view representing the section view of the section line. The baffle 422 may provide a more evenly-distributed porogen build-up rate across the baffle 422 than the baffles 222 and 322. Accordingly, the baffle 422 (or other baffles exhibiting exhaust plenum volumes similar to the exhaust plenum volume 454) may be particularly well-suited to reducing the cleaning time needed to clean accumulated porogen build-up from a process chamber.

Figure 5C:
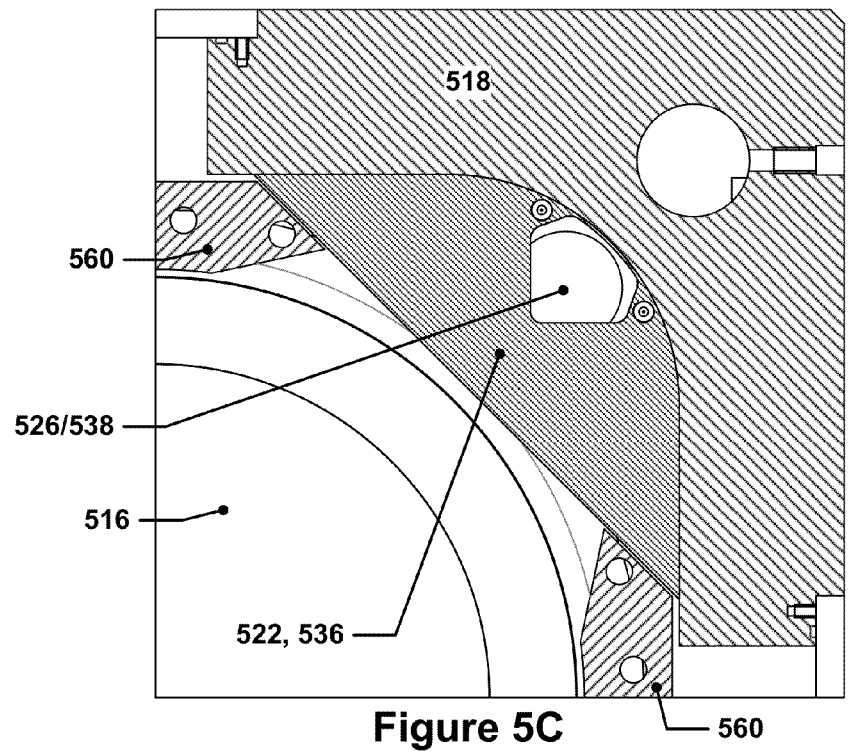
FIGS. 5C through 5G depict section views of the example UV cure semiconductor processing tool along the section lines 5C through 5G of FIG. 5B, respectively.

FIG. 5A depicts a top view of an example UV cure semiconductor processing tool. FIG. 5B depicts a section view of the example UV cure semiconductor processing tool within box 5B of FIG. 5A. FIGS. 5C through 5G depict section views of the example UV cure semiconductor processing tool along the section lines 5C through 5G of FIG. 5B, respectively. The baffle 522 used in this example is similar to the baffle 422, although the other baffles 322 and 222 may be used as well (although the flow paths may change as the baffles are changed).

In FIG. 5C, the section plane passes through the base surface 536 of the baffle 522. As can be seen, the exhaust passage 526 (which is round in cross-section in this example) is visible through the exhaust aperture 538 (which is substantially pentagonal in this example) of the baffle 522. Gas may flow into the exhaust passage 526 from the exhaust aperture 538 (although such flow is not depicted here, it may proceed in a direction generally "into" the page). Also visible in FIG. 5C are portions of a purge ring 560 (see FIGS. 6A and 6B for more descriptive views of the purge ring 560). The pedestal 516 and housing 518 are also visible in FIG. 5C.

Figure 5D:
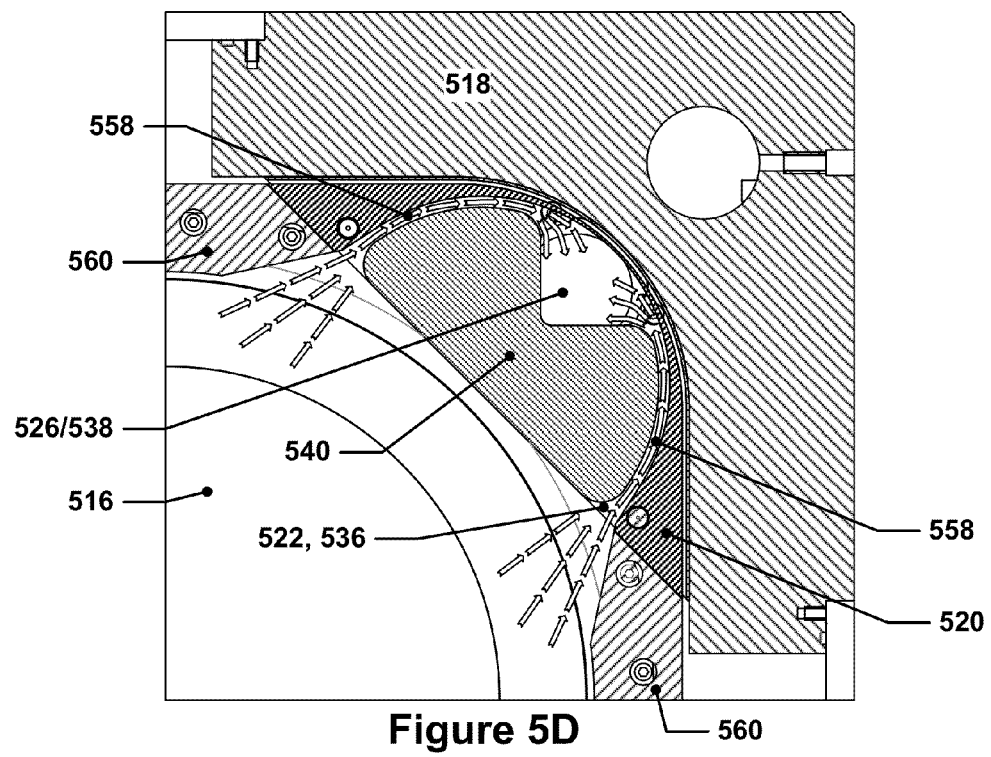

In FIG. 5D, the section plane passes through the baffle 522 at a point slightly above the base surface 536. Clearly visible in FIG. 5D is the raised profile section 540. Also indicated are the arcuate side passages 558 that direct flow (represented by gas flow arrows 540) around the raised profile section 540 and into the exhaust aperture 538. The arcuate side passages 558 may be formed between the raised profile section 540 and portions of heated exhaust cap 520.

Figure 5E:
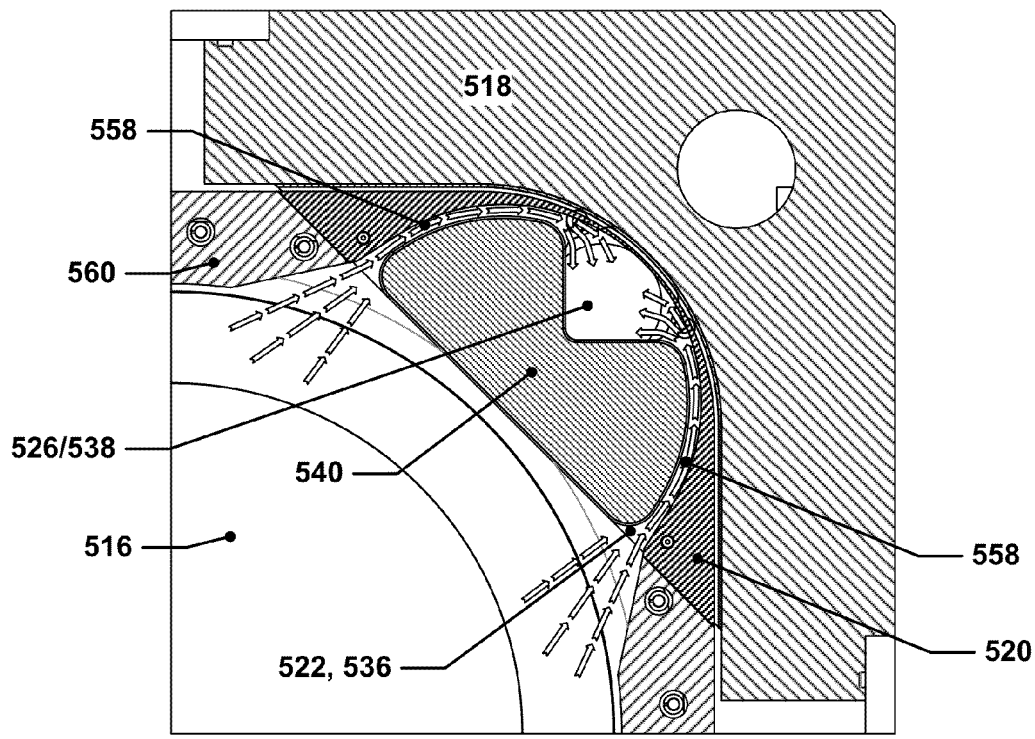

In FIG. 5E, the section plane passes through the baffle 522 at a point slightly above the point at which the raised profile section 540 starts to transition to the upper surface 556 (see FIG. 5G), i.e., just after the rounded transition between the upper surface 556 and the adjoining side surfaces begins.

Figure 5F:
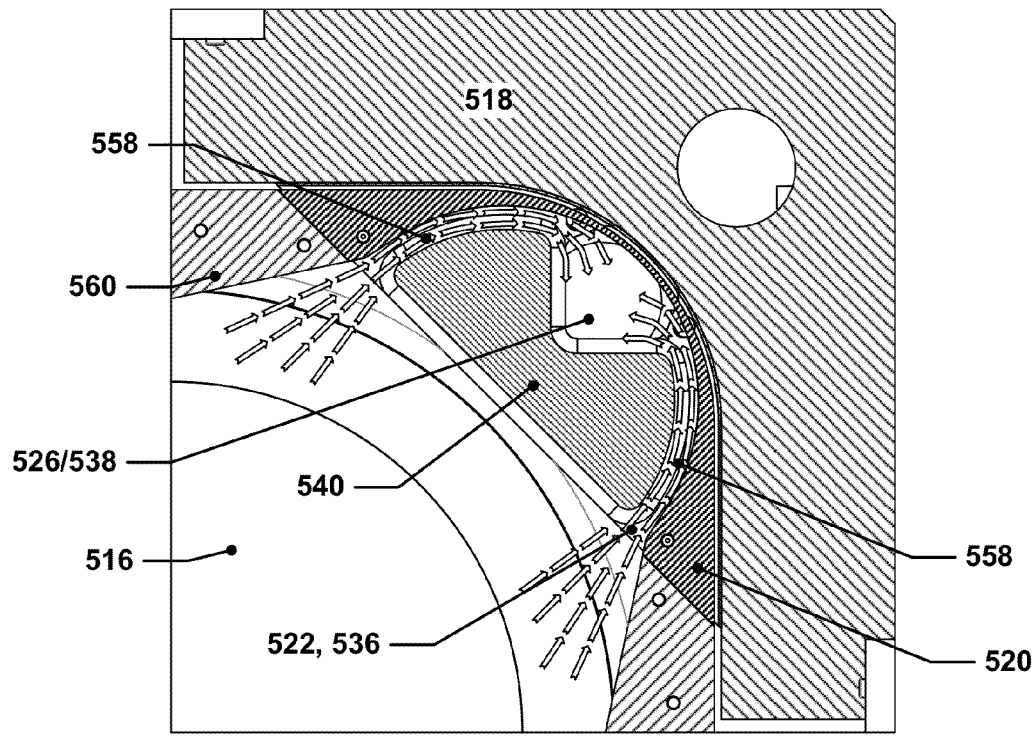

In FIG. 5F, the section plane passes through the baffle 522 at a point just below the upper surface 556. The arcuate side passages 558 have widened slightly, and some additional gas flow passes through the arcuate side passages 558 at this elevation.

Figure 5G:
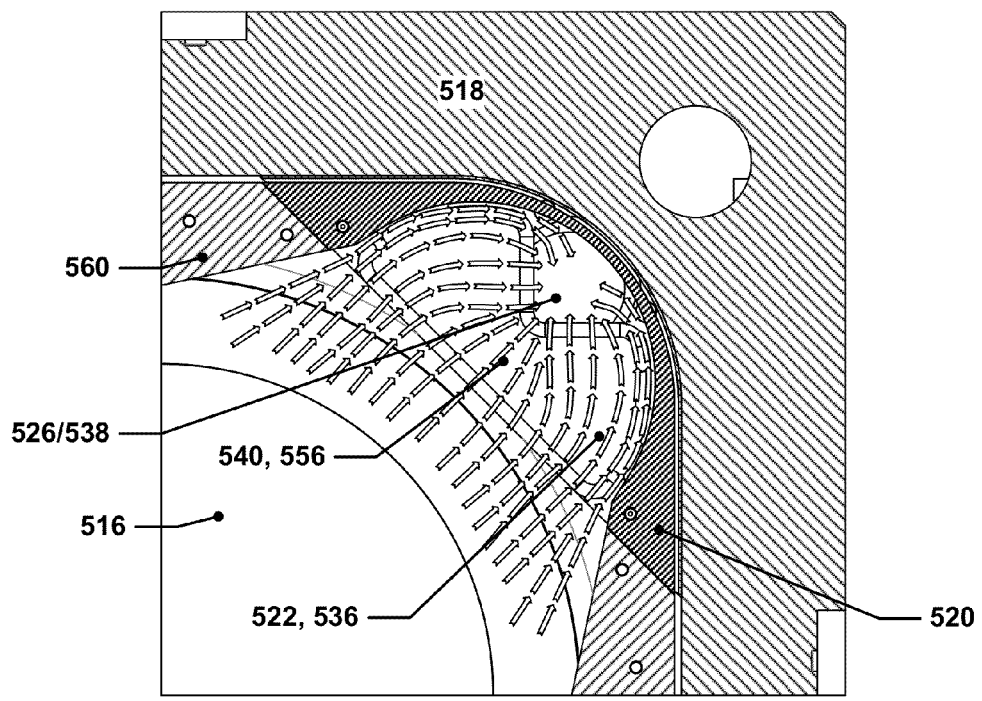

In FIG. 5G, the section plane passes through the baffle 522 at a point above the raised profile section 540. At this elevation, gas may flow not only in the arcuate side passages 558, but also over the raised profile section 540. The gas may then flow in the exhaust aperture 538 and be evacuated from the process chamber.

Figure 6A:
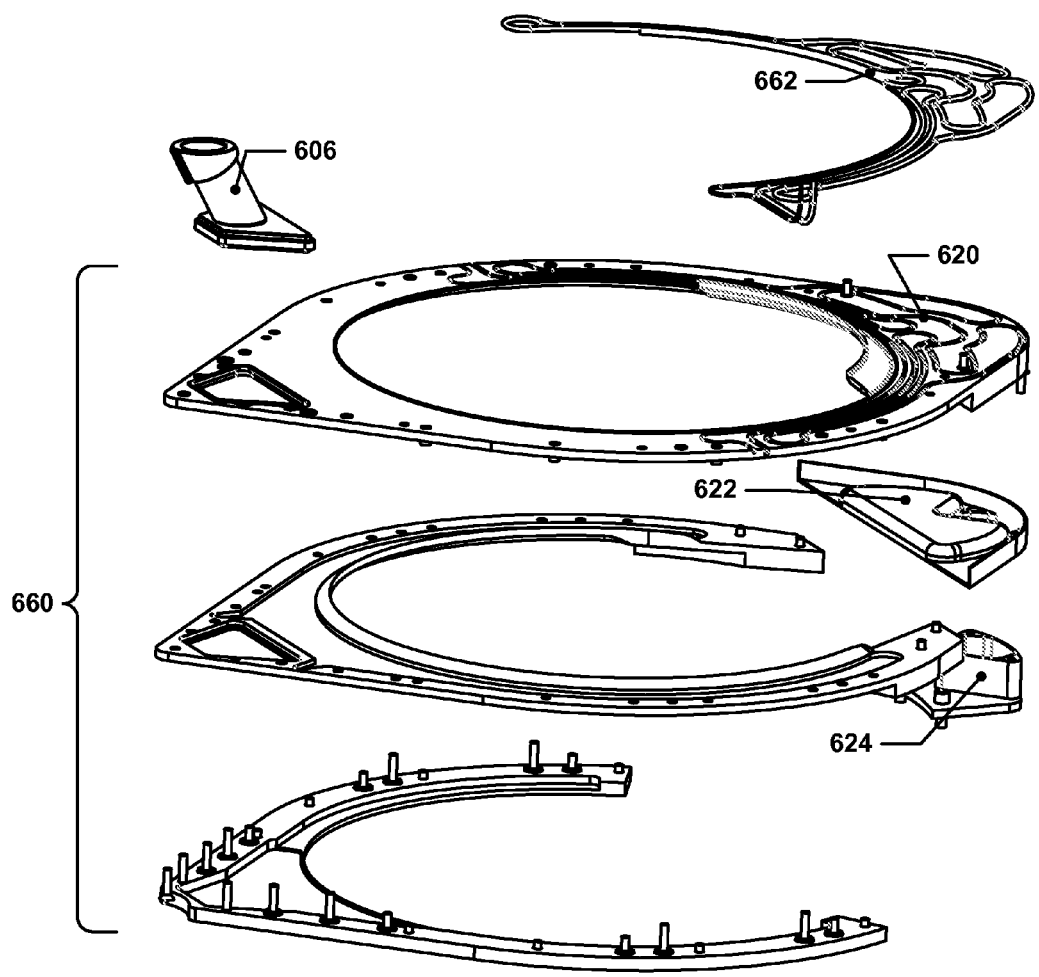
FIG. 6A depicts an exploded view of a purge ring that may be used with the example UV cure semiconductor processing tool of FIGS. 1A through 5G.
Figure 6B:
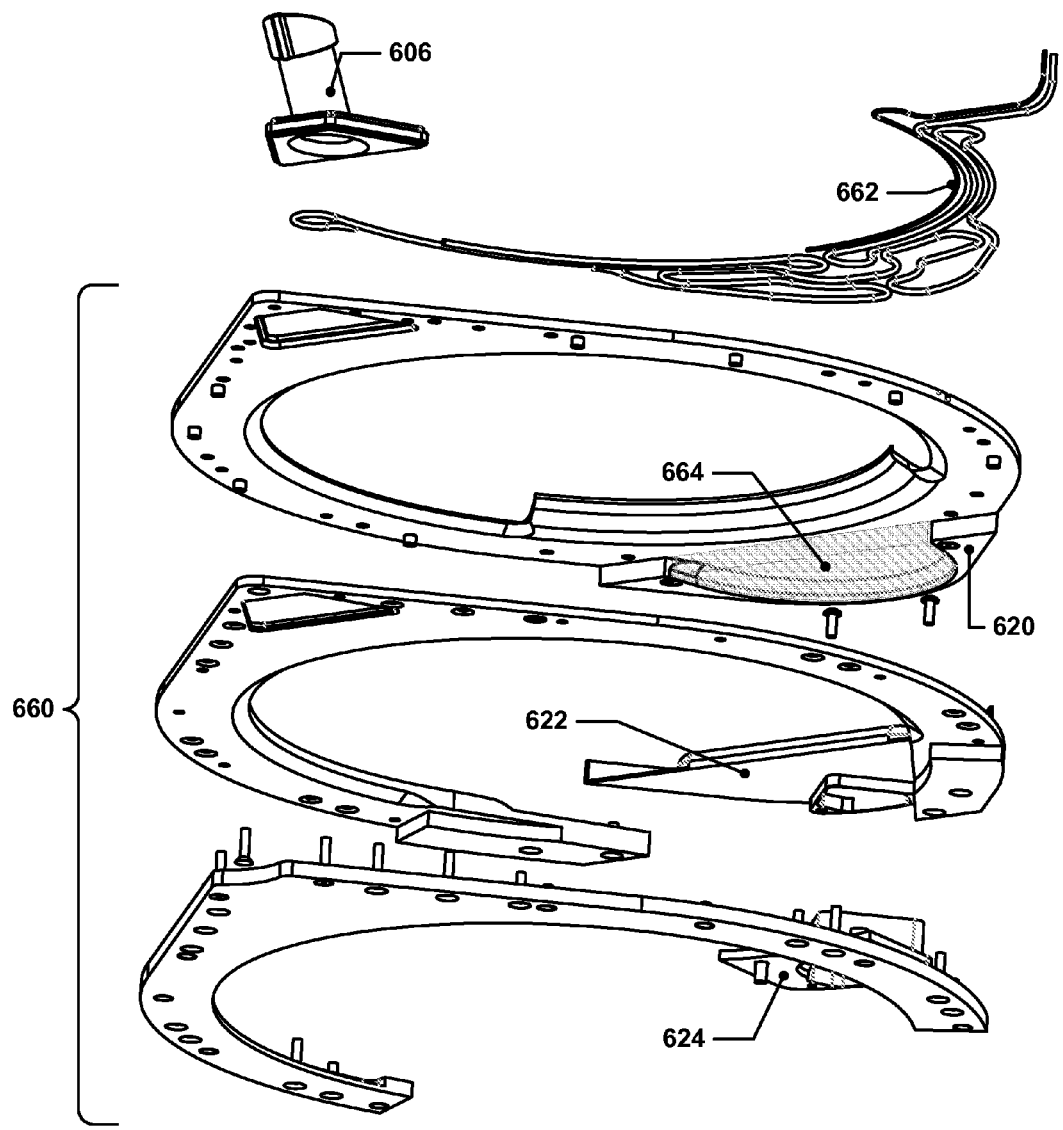
FIG. 6B depicts an exploded view from a different perspective of the purge ring of FIG. 6A.

At various points above, reference has been made to a purge ring. FIG. 6A depicts an exploded view of a purge ring that may be used with the example UV cure semiconductor processing tool of FIGS. 1A through 5G. FIG. 6B depicts an exploded view from a different perspective of the purge ring of FIG. 6A.

The purge ring may be a part or assembly that provides the gas inlet region (such as the gas inlet region 108) and the gas exhaust region (such as the gas exhaust region 110). The purge ring may have a circular interior area that is substantially free of material so as to allow UV light passing through the window of a process chamber used for UV cure to be unobstructed as it travels towards a wafer supported on a pedestal of the process chamber. The purge ring may have a portion that includes an internal flow passage or flow passages that are configured to direct carrier or cleaning gas from gas source 606 to one or more ports arranged about the interior of the purge ring in the gas inlet region 108. The port or ports may be generally configured to direct carrier or cleaning gas onto the window and towards the center of the pedestal or towards the gas exhaust region 110. The purge ring may be a multi-component part to facilitate constructing the internal flow passage or passages. A portion of the purge ring may serve as the heated exhaust cap 620, if such an exhaust cap is used. If a heated exhaust cap 620 is used, a heater element 662 may be inserted into channels machine or formed in the heated exhaust cap 620. The functionality of the purge ring may, of course, also be provided in a number of other arrangements that are also considered to be within the scope of this disclosure.

As can be seen in FIG. 6B, which shows the "underside" of the exploded purge ring 660, the heated exhaust cap 620 may be, for example, the component that is closest to the raised profile section of the baffle 622. The recess 664 (the recessed portion is shown as a shaded volume) may form a pocket within which the raised profile section of the baffle 622 nests.

Although various details have been omitted for clarity's sake, various design alternatives may be implemented. For example, the apparatus and methods discussed in this disclosure may apply not only to porogen removal, but to all UV processing where compounds may be outgassed and may need to be removed from the chamber. Therefore, the present examples are to be considered as illustrative and not restrictive, and the invention is not to be limited to the details given herein, but may be modified within the scope of the appended claims.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., wafer, using a spin-on or spray-on tool; (2) curing of photoresist using a hot plate or furnace or UV curing tool (such as that described herein); (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Another aspect of the invention is an apparatus configured to accomplish the methods described herein. A suitable apparatus includes hardware for accomplishing the process operations and a system controller having instructions for controlling process operations, e.g., carrier gas and cleaning gas flow control, in accordance with the present invention. The system controller may receive data from one or more sensors, e.g., temperature sensors, pressure sensors, etc., in order to control the UV light source and gas source(s) in accordance with semiconductor process requirements. The system controller will typically include one or more memory devices and one or more processors configured to execute the instructions so that the apparatus will perform a method in accordance with the present invention. Machine-readable media containing instructions for controlling process operations in accordance with the present invention may be communicatively coupled to the system controller.

While various implementations have been described herein, it should be understood that they have been presented by way of example only, and not limitation. Thus, the breadth and scope of the present disclosure should not be limited by any of the implementations described herein, but should be defined only in accordance with the following and later-submitted claims and their equivalents.

It will be understood that unless features in any of the above-described implementations are expressly identified as incompatible with one another or the surrounding context implies that they are mutually exclusive and not readily combinable in a complementary and/or supportive sense, the totality of this disclosure contemplates and envisions that specific features of those implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. An exhaust baffle for a process chamber for a semiconductor process, the process chamber having a) a gas inlet region configured to flow process gases into the process chamber, across a window of the chamber, and between the window and a pedestal within the process chamber and b) a gas exhaust region configured to evacuate the gas flowed into the process chamber via the gas inlet region from the process chamber, the exhaust baffle comprising:
 a base surface inscribed in a triangular region, the base surface having a first side edge, a second side edge, and an inlet edge;
 an exhaust aperture in the base surface and located opposite the inlet edge;
 a raised profile section located along the inlet edge, the raised profile section having an upper surface offset from the base surface by a first distance, wherein the exhaust baffle is configured to interface with at least one other component in the gas exhaust region of the process chamber such that the base surface is offset from the at least one other component in the gas exhaust region of the process chamber by a second distance and such that the first distance is at least 50% of the second distance.

2. The exhaust baffle of claim 1, wherein the exhaust baffle is substantially symmetric about a symmetry plane that intersects a vertex of the triangular region opposite a first leg of the triangular region proximate to the inlet edge and that is substantially perpendicular to the first leg.

3. The exhaust baffle of claim 2, wherein the inlet edge is substantially straight and corresponds with the first leg and the first side edge and the second side edge are substantially coincident with second and third legs of the triangular region.

4. The exhaust baffle of claim 2, wherein the base surface has a rounded corner proximate to the vertex of the triangular region opposite the first leg.

5. The exhaust baffle of claim 2, wherein the raised profile section has a cross-section in a plane parallel to the base surface that substantially corresponds with a semicircular area of radius R, wherein the semicircular area has a notch in it substantially centered on the symmetry plane and extending towards the inlet edge by a distance of at least approximately ½ R.

6. The exhaust baffle of claim 5, wherein the at least one other component of the process chamber with which the exhaust baffle is configured to interface includes a substantially semicircular recess with a radius R', where R' is at least 1.05R.

7. The exhaust baffle of claim 6, wherein the difference between R' and R is at least approximately twice as large as the difference between the first distance and the second distance.

8. The exhaust baffle of claim 5, wherein the notch is a triangular notch with an included angle of approximately 90°.

9. The exhaust baffle of claim 5, wherein the notch is a semicircular notch.

10. The exhaust baffle of claim 5, wherein the first distance is at least 75% of the second distance.

11. The exhaust baffle of claim 2, wherein:
 the raised profile section has a substantially symmetric trapezoidal cross-sectional shape in a plane substantially perpendicular to the inlet edge, and
 the trapezoidal cross-sectional shape is widest at the base surface.

12. A UV semiconductor processing tool comprising:
 a process chamber;
 a pedestal located within the process chamber;
 an ultraviolet (UV) light source positioned so as to expose the pedestal to UV radiation from the UV light source;
 a window positioned between the UV light source and the pedestal;
 a gas inlet region configured to flow process gases into the process chamber, across the window, and between the window and the pedestal; and
 a gas exhaust region having an exhaust baffle, the gas exhaust region configured to evacuate the gas flowed into the process chamber via the gas inlet region from the process chamber, wherein the baffle has:
 a base surface inscribed in a triangular region, the base surface having a first side edge, a second side edge, and an inlet edge;
 an exhaust aperture in the base surface and located opposite the inlet edge;
 a raised profile section located along the inlet edge, the raised profile section having an upper surface offset from the base surface by a first distance, wherein the exhaust baffle is configured to interface with at least one other component of the process chamber such that the base surface is offset from the at least one other component by a second distance and such that the first distance is at least 50% of the second distance.

13. The UV semiconductor processing tool of claim 12, wherein the exhaust baffle is substantially symmetric about a symmetry plane that intersects a vertex of the triangular region opposite a first leg of the triangular region proximate to the inlet edge and that is substantially perpendicular to the first leg.

14. The UV semiconductor processing tool of claim 13, wherein the inlet edge is substantially straight and corresponds with the first leg and the first side edge and the second side edge are substantially coincident with second and third legs of the triangular region.

15. The UV semiconductor processing tool of claim 13, wherein the raised profile section has a cross-section in a plane parallel to the base surface that substantially corresponds with a semicircular area of radius R, wherein the semicircular area has a notch in it substantially centered on the symmetry plane and extending towards the inlet edge by a distance of at least approximately ½ R.

16. The UV semiconductor processing tool of claim 15, wherein the at least one other component of the process chamber with which the exhaust baffle is configured to interface includes a substantially semicircular recess with a radius R', where R' is at least 1.05R.

17. The UV semiconductor processing tool of claim 16, wherein the difference between R' and R is at least approximately twice as large as the difference between the first distance and the second distance.

18. The UV semiconductor processing tool of claim 15, wherein the notch is a triangular notch with an included angle of approximately 90°.

19. The UV semiconductor processing tool of claim 15, wherein the first distance is at least 75% of the second distance.

20. The UV semiconductor processing tool of claim 13, wherein:
    the raised profile section has a substantially symmetric trapezoidal cross-sectional shape in a plane substantially perpendicular to the inlet edge, and
    the trapezoidal cross-sectional shape is widest at the base surface.

* * * * *